United States Patent [19]
Yeh

[11] Patent Number: 5,821,176
[45] Date of Patent: Oct. 13, 1998

[54] COLD FINGER DESIGN IN AN ENERGY DISPERSIVE X-RAY ANALYZER

[75] Inventor: Lun-Shu Ray Yeh, Berkeley Heights, N.J.

[73] Assignee: Philips Electronics North America Corporation, NY, N.Y.

[21] Appl. No.: 522,036

[22] Filed: Aug. 31, 1995

[51] Int. Cl.[6] ................................................ B32B 25/02
[52] U.S. Cl. ..................... 442/38; 428/317.9; 428/318.4; 428/71; 428/75
[58] Field of Search ........................ 250/370.15; 428/247, 428/313.3, 317.9, 318.4, 69, 71, 75, 230, 38

[56] References Cited

U.S. PATENT DOCUMENTS

| | | | |
|---|---|---|---|
| 3,257,265 | 6/1966 | Isenberg | 428/313.3 |
| 3,891,786 | 6/1975 | Conklin | 428/136 |
| 4,025,687 | 5/1977 | Wooler et al. | 428/318.4 |
| 4,204,015 | 5/1980 | Wardlaw et al. | 428/34 |
| 4,212,917 | 7/1980 | Skowronski et al. | 428/318.4 |
| 4,304,824 | 12/1981 | Karpinski | 428/69 |
| 4,513,041 | 4/1985 | Delluc | 428/318.4 |
| 4,666,164 | 5/1987 | Becker et al. | 428/318.4 |
| 5,012,499 | 4/1991 | Vali et al. | 378/84 |
| 5,225,677 | 7/1993 | Yeh et al. | 250/336.1 |
| 5,235,817 | 8/1993 | Gallagher et al. | 62/51.1 |
| 5,268,578 | 12/1993 | Yeh | 250/370.01 |
| 5,274,237 | 12/1993 | Gallagher et al. | 250/370.15 |
| 5,302,831 | 4/1994 | Gallagher et al. | 250/397 |
| 5,382,467 | 1/1995 | Widlund et al. | 428/284 |
| 5,422,175 | 6/1995 | Ito et al. | 428/318.4 |

*Primary Examiner*—Michael J. Tokar
*Assistant Examiner*—Richard Hanig
*Attorney, Agent, or Firm*—Anne E. Barschall

[57] ABSTRACT

A cold finger for an energy dispersive x-ray analyzer is surrounded by an insulating material which includes two layers of aluminum coated polyester and a layer of plastic netting sandwiched between the two layers of aluminum coated polyester. The material is flexible and hugs the cold finger and reduces thermal loss.

14 Claims, 3 Drawing Sheets

COLD FINGER DESIGN IN AN ENERGY DISPERSIVE X-RAY ANALYZER

BACKGROUND OF THE INVENTION

1. Field of the Invention

The invention relates to the field of energy dispersive x-ray analyzers and in particular to insulating cold fingers to be used in such analyzers.

2. Background of the Invention

Various aspects of energy dispersive x-ray analyzers have been discussed in patents such as U.S. Pat. Nos. 5,274,237, 5,302,831, 5,235,817, and 5,225,677, all of which are incorporated herein by reference.

FIG. 1 shows a prior art energy dispersive x-ray analyzer. A dewar 50 which contains liquid nitrogen coolant 48. Conductive braided wire 122 flexibly attaches cold finger 6 to the dewar 50. The braided wire 122 reduces vibrations at the detector and therefore reduces noise. The conductor 14 at the center of the cold finger 6 conducts heat from detector 18 to the dewar 50. The detector 18 is located adjacent to a scanning or transmission electron microscope which bombards a sample with an electron beam 32. The detector 18 detects x-rays emitted by the sample. The detector 18 must be kept cold to reduce noise. A container 12 surrounds the copper conductor 14 and insulation material, not shown. The container 12 and the detector 18 need to be small, so that the detector 18 can fit into the space 28 between the scanning or transmission electron microscope and the sample. In order for the container 12 to be small, the insulation material must be very thin. The insulation must also be very effective, as the conductor is supposed to be maintained at the temperature of liquid nitrogen (77° K. or −196° C.), while the outside of the container 12 is at room temperature. The insulation also had to be very flexible so that it could be wrapped about the various structures attached to the conductor 14 and around the braided wire 122. These structures included joints, bends, and installed electronic components. The area inside container 12 and communicating areas are kept evacuated to improve insulation.

The prior art insulation material surrounding the conductor 14 was aluminum coated polyethylene terephthalate (a type of polyester also known by the trademark MYLAR, a trademark of the Dupont company) film wrapped about the conductor 14 and various supportive structures around the conductor 14. The aluminum side of the film should face the warmer temperature. Typically two layers of aluminum-coated polyester were used. Additional layers are not found to give any additional insulative effect.

The amount of cooling loss in the cold finger depends on the length of the finger. A longer finger means more loss. Typically the detector is 25 to 50 centimeters from the dewar. The prior art configuration was able to keep the detector 18 at about 110° K., while the liquid nitrogen was at 77° K. In other words there was a 33° K. loss of cooling along the length of the detector. This loss of cooling adds noise to the output of the detector.

One solution to this problem which has been proposed was to alter the shape of the dewar 50, so that the coolant 48 extended down into the area 64, 68 connecting the dewar 50 to the cold finger 6. This had the disadvantage that water vapor, condensing out of opening 116 would freeze into ice, which is heavier than liquid nitrogen, and which would therefore fall into the areas 64 surrounding the connection to the cold finger. Ice is not a good conductor of heat. Accordingly, the accumulation of ice would further raise the temperature of the detector. The only way to eliminate the ice was to allow the dewar to warm up so that the moisture could dry out, causing down time for the detector.

As noted before, additional layers of aluminum coated polyester around the conductor 14 did not help in lowering the temperature of the detector 18.

SUMMARY OF THE INVENTION

Accordingly, it is an object of the invention to improve the insulation around the conductor 14, without increasing the size of the container 12.

This object is achieved by preventing conduction between layers of insulation around the conductor 14 by insertion of non-conductive spacer material between the layers.

BRIEF DESCRIPTION OF THE DRAWING

The invention will now be described by way of non-limitative example with respect to the drawing in which.

DETAILED DESCRIPTION OF THE PREFERRED EMBODIMENTS

In order to understand the insulation problems on the cold finger it was first necessary to determine why additional layers of aluminum coated polyester were not improving the insulative effect. It was determined that the lack of the insulative effect was due to heat conduction between the wrapped layers. Accordingly, some spacing between the layers was necessary to create an evacuated space around the layers.

However, it was difficult to achieve the necessary spacing. The spacing had to be preserved over all of the cold finger, to prevent conduction. Moreover, the spacing had to follow the contours of the cold finger which includes structures such as A, B, E, C, and D, just as the aluminum coated polyester did, so that the size of the container 12 would not be increased.

In addition, the spacing material had to have poor thermal conductivity and little vacuum out-gassing.

Figure 1:
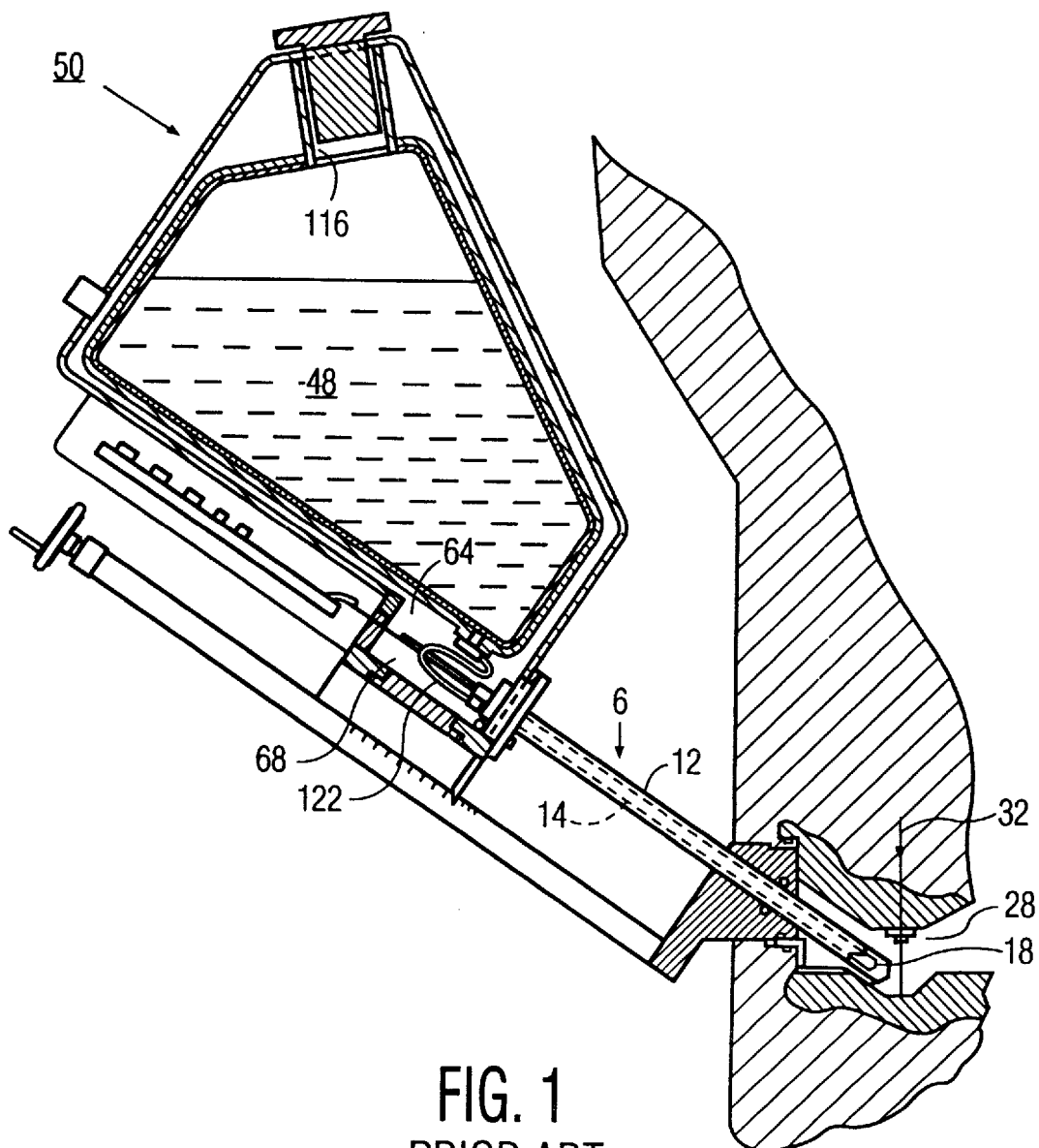
FIG. 1 is a cross section of an energy dispersive x-ray analyzer according to the prior art.
Figure 2:
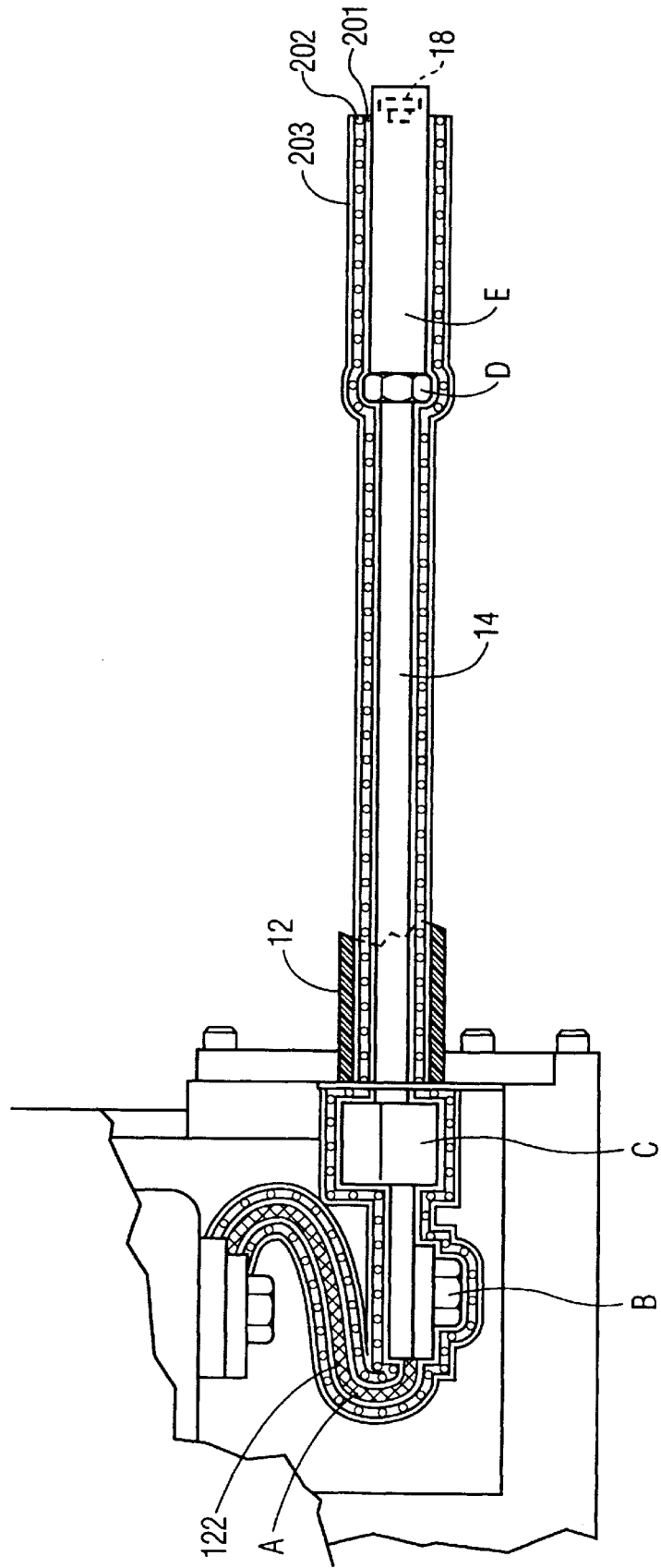
FIG. 2 is a cross section of an energy dispersive x-ray analyzer with a cold finger insulated according to the invention.

FIG. 2 shows the cold finger assembly without the cover of 12. The first aluminum coated polyester layer or layers 201 are wrapped about conductor 14 and braided wire 122. Spacing material is shown at 202. A second layer or layers of aluminum coated polyester is shown at 203.

It was found that a stretchable polyethylene net, such as Flexguard II made by Nalle Plastics, Inc. of 220 E. St. Elmo Road in Austin Tex., served the purpose of spacing layers of insulating material while preserving the size and shape of the insulation. This netting is in the form of a tube which stretches as it is pulled on over a part and was previously used to prevent parts from damage from abrasion, nicks, scratches and breakage. Prior to installation, the diameter of the tube of netting is less than the diameter of the part to be covered by the netting. After installation, the netting stretches over the part, hugging the contours of the part. The net includes open spaces in the outside of the tube. The spaces can be evacuated, which improves insulation of the conductor 14.

With the netting according to the invention, the cold finger, which was previously showing a temperature of 110° K. at the detector, improved to 88°–89° K. at the detector. This improvement is particularly significant if the detector is germanium as these detectors are particularly sensitive to heat. In fact, without this improvement in the insulation, the performance of a germanium detector would be significantly degraded. The invention is also advantageous with silicon detectors.

One of ordinary skill in the art might devise any number of alternative embodiments to the invention. Any type of aluminum coated polyester can be used. Aluminum foil may be substituted for aluminum coated polyester. Any other metal with low thermal emissivity can be substituted for aluminum. Any polymer material which has poor thermal conductivity and good out-gassing properties may be substituted for polyethylene in the netting. These other polymers include ethylene copolymers, polypropylene and other polyolefins, polyesters, polyvinyl and vinyl copolymers, polyamides and imides, polycarbonates, fluoroplastics, copolymers of various combinations, and composites. These other polymers can also be substituted for the polyethylene terephthalate in the film. While the preferred embodiment includes a netting which has a criss-cross pattern, any pattern of netting is possible. While the preferred embodiment is in the form of stretchable tubing, which slips on easily, other shapes and configurations are possible. For instance, netting wraps, flexible rods, flexible tubings, and beads provide plenty of void space and could function in place of the tubes of netting. An additional layer of polytetrafluoroethylene film in the form of tape can be used as an added insulator.

Figure 3:
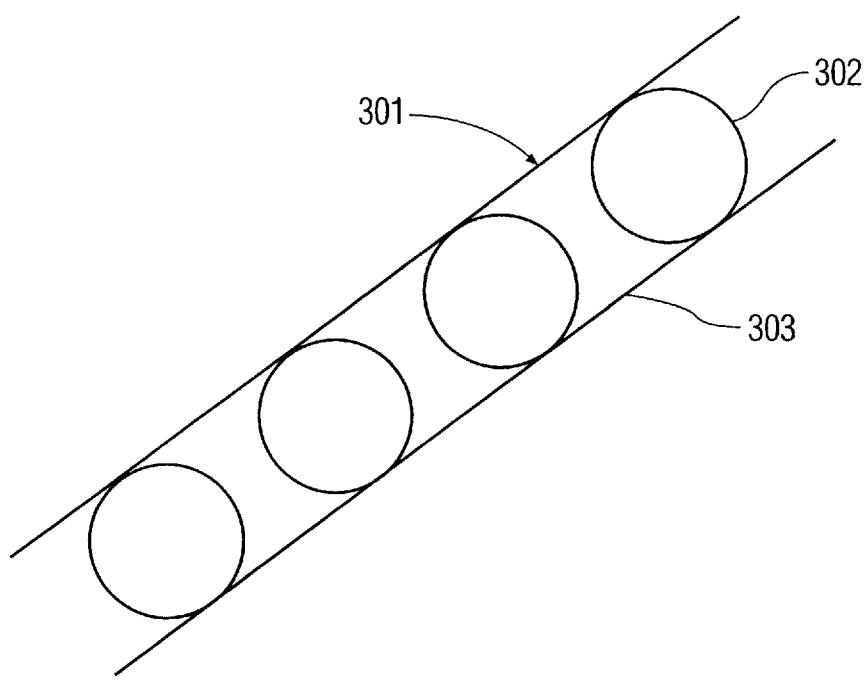
FIG. 3 is a schematic of the insulating material of the invention without the x-ray analyzer.

FIG. 3 shows a schematic of the insulating material according to the invention without the x-ray analyzer, including a first layer 301, a second layer 302, and a third layer 303.

I claim:

1. A thermally insulating material comprising
   at least one first layer, which first layer includes metallic film;
   a second layer including stretchable plastic netting adjacent to the first layer, which netting defines a multiplicity of voids; and
   at least one third layer, which third layer includes metallic film, the third layer being adjacent to the second layer, so that the second layer is sandwiched between the first and third layers
   the first, second, and third layers together forming a flexible material.

2. The material of claim 1 wherein the second layer is evacuated.

3. The material of claim 1 wherein at least one of the first and third layers comprises aluminum coated polyester.

4. The material of claim 3 wherein the polyester comprises polyethylene terephthalate.

5. The material of claim 1 wherein at least one of the first and second layers comprises aluminum foil.

6. The material of claim 1 wherein the netting is in the form of a tube.

7. The material of claim 1 wherein the netting is a wrap.

8. The material of claim 1 wherein the second layer is in the form of a flexible tube.

9. The material of claim 1 wherein the second layer includes plastic spacing parts.

10. The material of claim 1 wherein the netting is made of one of the following: polyethylene, ethylene copolymers, polypropylene and other polyolefins, polyesters, polyvinyl and vinyl copolymers, polyamides and imides, polycarbonates, fluoroplastics, copolymers of various combinations, and composites.

11. A cold finger for an energy dispersive x-ray analyzer comprising a conductor surrounded by the insulating material of any one of claims 1–5, 6, 7, 8, 9, or 10.

12. An energy dispersive x-ray analyzer comprising
    a dewar for containing liquid nitrogen;
    the cold finger of claim 11; and
    an x-ray detector.

13. The analyzer of claim 12 wherein the x-ray detector is made of germanium.

14. The analyzer of claim 12 wherein the x-ray detector is made of silicon.

* * * * *